United States Patent [19]

Tuan et al.

[11] Patent Number: 5,338,750
[45] Date of Patent: Aug. 16, 1994

[54] FABRICATION METHOD TO PRODUCE PIT-FREE POLYSILICON BUFFER LOCAL OXIDATION ISOLATION

[75] Inventors: Hsiao-Chin Tuan; Hu H. Chao, both of Hsinchu, Taiwan

[73] Assignee: Industrial Technology Research Institute, Hsinchu, Taiwan

[21] Appl. No.: 982,708

[22] Filed: Nov. 27, 1992

[51] Int. Cl.$^5$ ............................................. H01L 21/76
[52] U.S. Cl. ........................................ 437/70; 437/69; 437/926; 437/968
[58] Field of Search .................... 437/69, 70, 926, 968

[56] References Cited

U.S. PATENT DOCUMENTS

| | | | |
|---|---|---|---|
| 4,407,696 | 10/1983 | Han et al. | 437/69 |
| 4,897,364 | 1/1990 | Nguyen et al. | 437/69 |
| 5,002,898 | 3/1991 | Fritzinger et al. | 437/69 |
| 5,196,367 | 3/1993 | Lu et al. | 437/69 |
| 5,215,930 | 6/1993 | Lee et al. | 437/69 |

FOREIGN PATENT DOCUMENTS

| | | | |
|---|---|---|---|
| 0053957 | 3/1982 | Japan | 437/968 |
| 0076856 | 5/1982 | Japan | 437/69 |
| 0090960 | 6/1982 | Japan | 437/968 |
| 0208156 | 12/1982 | Japan | 437/968 |
| 0074350 | 4/1986 | Japan | 437/69 |
| 0204746 | 8/1988 | Japan | 437/69 |
| 0214142 | 8/1989 | Japan | 437/69 |
| 0068930 | 3/1990 | Japan | 437/69 |
| 0097038 | 4/1990 | Japan | 437/69 |

*Primary Examiner*—Tom Thomas
*Assistant Examiner*—Trung Dang
*Attorney, Agent, or Firm*—George O. Saile; Stephan B. Ackerman

[57] ABSTRACT

A method of forming a silicon oxide isolation region on the surface of a silicon wafer consisting of a thin layer of silicon oxide on the wafer, a layer of impurity-doped polysilicon, and a layer of silicon nitride. The oxidation mask is formed by patterning the silicon nitride layer and at least a portion of the doped polysilicon layer. The silicon oxide field isolation region is formed by subjecting the structure to a thermal oxidation ambient. The oxidation mask is removed in one continuous etching step using a single etchant, such as phosphoric acid which etches the silicon nitride and polysilicon layers at substantially the same rate to complete the formation of the isolation region without pitting the monocrystalline substrate.

11 Claims, 2 Drawing Sheets

FABRICATION METHOD TO PRODUCE PIT-FREE POLYSILICON BUFFER LOCAL OXIDATION ISOLATION

BACKGROUND OF THE INVENTION

1. Field of the Invention

The invention relates to the manufacture of highly dense integrated circuits and more particularly to the formation of a silicon oxide isolation region within the integrated circuit.

2. Description of the Prior Art

In the manufacture of highly dense integrated circuits, individual device structures are typically separated and electrically isolated by means of a field oxide isolation region, which is typically produced by the exposure of a silicon wafer to an oxidizing atmosphere while using an oxidation mask to protect regions which are not desired to be oxidized. Various masking layers have been used as this oxidation mask such as of a pad oxide, undoped polycrystalline silicon, silicon nitride and the like are typically deposited on top of the active region to serve as a buffer during thermal oxidation. Subsequently, this protective layer is removed by suitable etching technique.

However, in the traditional Polysilicon Buffer LOCOS (local oxidation) technique, during the etch of the polysilicon, pits can form around the edge of the pad oxide, leading to damage of the silicon substrate.

FIG. 1 shows the prior art. Shown are layer of a pad oxide 5 after the formation of the field oxide layer 7 using an undoped polysilicon layer and silicon nitride layer process. During formation of the field oxide 7, the polysilicon in the vicinity of the field oxide being formed tends to be weakened due to stress. During subsequent removal by etching of these protective layers, "pits" 8 may form in the pad oxide 5, resulting in damage to the silicon substrate as shown in FIG. 1.

Workers in the field are well aware of this pitting problem. A solution to the "pits" problem has been patented by L. B. Fritzinger et al in U.S. Pat. No. 5,002,898. The novel solution consisted of adding a protective oxide layer between the polysilicon buffer and silicon nitride layers. Removal of the silicon nitride by wet etching did not affect the polysilicon layer due to the protection afforded by the protective oxide. The protective oxide and polysilicon layers could then be removed without damage to the substrate.

SUMMARY OF THE INVENTION

It is a principal object of the invention to provide a method for forming a field oxide which by the nature of the method will prevent the formation of "pits" in the pad oxide and subsequent damage to the silicon substrate.

It is a further object of this invention to provide a method of removing the protective layers over the active regions in one continuous step, to reduce the processing required to complete formation of an integrated circuit and to overcome the pit formation problem of the prior art processes.

These objects are achieved by forming a silicon oxide isolation region on the surface of a silicon wafer consisting of a thin layer of silicon oxide on the wafer, a layer of impurity-doped polysilicon, and a layer of silicon nitride. The oxidation mask is formed by patterning the silicon nitride layer and at least a portion of the doped polysilicon layer. The silicon oxide field isolation region is formed by subjecting the structure to a thermal oxidation ambient. The oxidation mask is removed in one continuous etching step using a single etchant which etches the silicon nitride and polysilicon layers at substantially the same rate to complete the formation of the isolation region.

DESCRIPTION OF THE PREFERRED EMBODIMENTS

Figure 1:
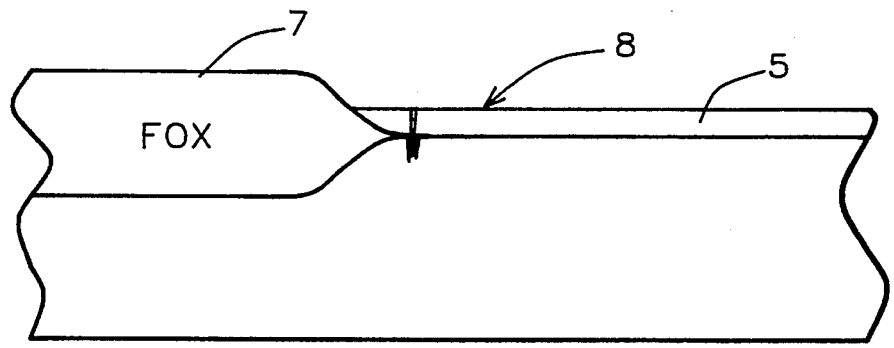
FIG. 1 is a schematic cross-sectional representation of the result of a Prior Art process for forming the field oxide region of an integrated circuit which contains the pitting problem.
Figure 2:
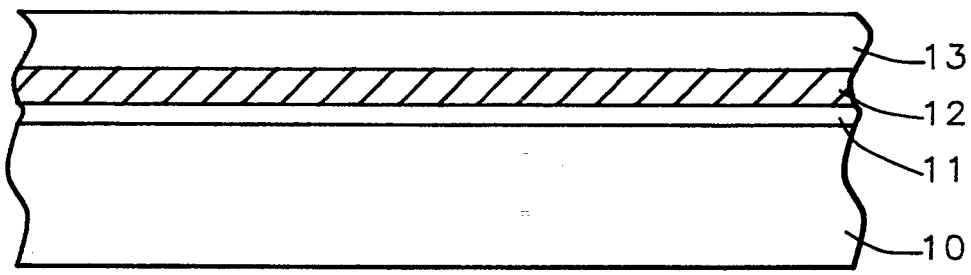
FIGS. 2 to 5 are a schematic cross-sectional representation of a new method for forming the field oxide region and for removal of the protective oxidation mask layer.

Referring now more particularly to FIG. 2, there is shown an embodiment method for making the field oxide of the present invention. The first series of steps involves the formation of the pad oxide layer 11 on the silicon substrate 10. The surface of the bare silicon substrate 10 is thermally oxidized to form the desired pad oxide layer 11, by exposure to dry or wet oxygen at a temperature of about 800° to 900° C. for time sufficient to form the preferred thickness of between about 50 and 300 Angstroms. This layer may alternatively be deposited by chemical vapor deposition methods.

The polysilicon layer 12 is blanket deposited by LPCVD (Low Pressure Chemical Vapor Deposition) method. This method to produce the critically doped polysilicon layer 12 can be accomplished by either forming the doped layer in situ at a temperature in the range of about 620° to 700° C. or forming undoped polysilicon and then doping the layer as by thermal diffusion or ion implantation. The critical element of the processes is to assure a uniform, high dosage doping of the polysilicon with a dopant such as phosphorus or arsenic of greater than about 1 E 19 atoms/$cm^3$. The preferred thickness of the polysilicon layer 12 is between about 1200 and 4000 Angstroms. The undoped polysilicon layer 12 is ion implanted with phosphorous, arsenic or boron ions under the conditions $5 \times 10$ E 14 to $5 \times 10$ E 16 atoms/$cm^2$ dosage with energy of between about 30 and 80 Kev. followed by an anneal at more than about 850° C. for more than about 25 minutes in an inert atmosphere, or thermally doped with phosphorus oxychloride at a temperature greater than about 850° C.

The silicon nitride layer 13 is blanket deposited by LPCVD using standard silicon and nitrogen sources and conditions to produce a thickness in the preferred range of 1500 to 3500 Angstroms.

Figure 3:
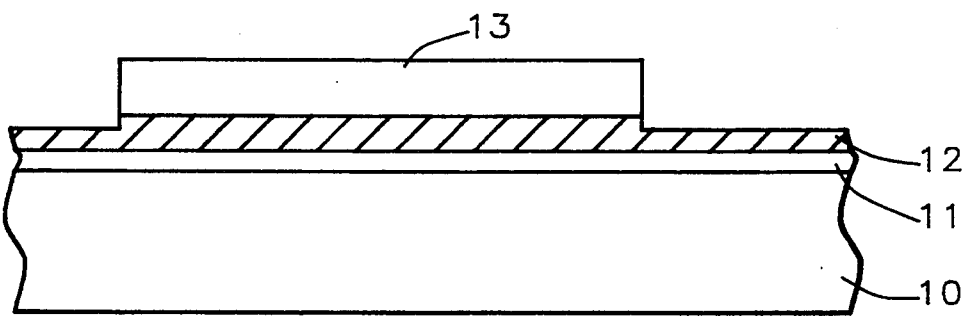

FIG. 3 shows the silicon nitride layer 13, after being patterned using a resist masking layer and suitable etching to define a region to be protected by the oxidation mask during field oxide formation. The lithography and etching are conventional. The preferred etching process is anisotropic etching in a suitable plasma including chlorofluorocarbon materials as is known in the art. It is shown in FIG. 3 that the etching step of the silicon nitride layer 13 also etches a portion of doped polysilicon layer 12 such that the remaining polysilicon has a thickness of between about 1000 to 3500 Angstroms which is acceptable and may be preferred.

Figure 4:
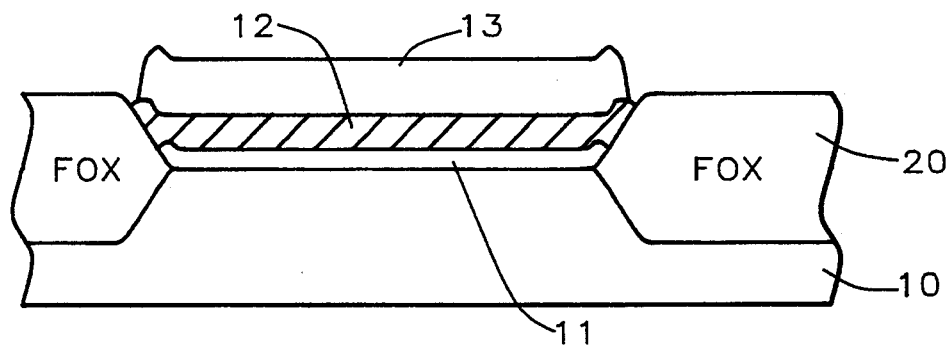

FIG. 4 shows the result exposed unmasked surface which is now thermally oxidized to grow the field silicon oxide 20, at a temperature of more than about 900° C. in a steam ambient for time sufficient to form the conventionally desired field silicon oxide layer 20.

Figure 5:
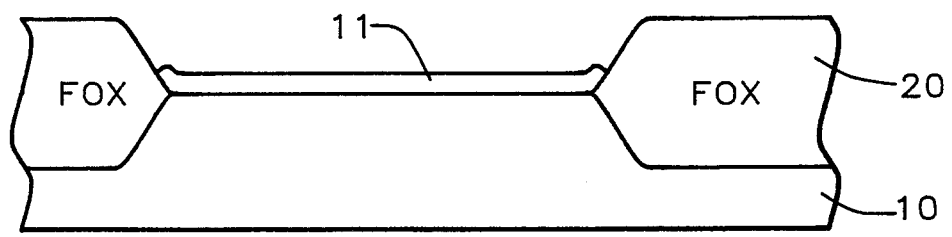

FIG. 5 shows the structure of FIG. 4 after the key and critical step of stripping layers 12 and 13 from the active region, leaving the pad silicon oxide layer 11. In the preferred embodiment, layers 12 and 13 are simultaneously etched using phosphoric acid ($H_3PO_4$) at an operative temperature range of between about 150 to 180 and preferably about 155° to 165° C. The operative concentration of the phosphoric acid in water is 98+/−0.5% $H_3PO_4$ and 2+/−0.5% $H_2O$. The etching process will end at the silicon oxide layer 11 interface, because phosphorus acid solution does not attack silicon oxide.

The following are examples which are intended to merely help in the understanding of the invention and not to limit the invention.

EXAMPLE I

A layer of undoped polysilicon was deposited by the CVD process as described above to a thickness of 3500 Angstroms at 620° C. on a silicon oxide layer covering a silicon wafer. The layer was doped using $POCl_3$, at a temperature of 950° C. for a time of 8 minutes in a diffusion furnace. The sample was cooled to room temperature. The wafer sample was then immersed into $H_3PO_4$ bath at a temperature of 160° C. for 90 minutes. The etching results recorded in TABLE I are average results from samples taken at 5 different locations on the wafer.

EXAMPLE II

A layer of polysilicon was (in-situ) doped with phosphorus during deposition, and deposited to a thickness of 1500 Angstroms at 675° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

EXAMPLE III

A layer of undoped polysilicon was deposited to a thickness of 3500 Angstroms at 620° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

EXAMPLE IV

A layer of undoped polysilicon was deposited to a thickness of 4500 Angstroms at 620° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

TABLE I

| EXAMPLE | | thickness (Angstroms) | etching rate (Angstroms/hr) |
|---|---|---|---|
| I | before etch | 3258 | |
| | after etch | 2100 | |
| | etching loss | 1158 | |
| | Etching rate | | 772 |
| II | before etch | 1574 | |
| | after etch | 524 | |
| | etching loss | 1050 | |
| | Etching rate | | 630 |
| III | before etch | 4547 | |
| | after etch | 4529 | |
| | etching loss | 18 | |
| | Etching rate | | 11 |
| IV | before etch | 3658 | |
| | after etch | 3406 | |
| | etching loss | 252 | |
| | Etching rate | | 151 |

The results of the Examples I–IV show that phosphoric acid very effectively etches phosphorus oxychloride doped polysilicon and phosphorus in situ doped polysilicon. However, undoped polysilicon does not satisfactorily etch with phosphoric acid. Silicon nitride is known in the art as satisfactorily etchable with phosphoric acid. Our conclusion is that phosphoric acid at about 160° C. can etch heavily phosphorus doped polysilicon. The etching rate is between about 600 to 800 Angstroms per hour.

EXAMPLES V–XII

Similar experiments have been performed for uniform and high dose doping with arsenic and boron using ion implantation sources of, respectively arsenic and boron difluoride. The results with doping levels of greater than about 1 E 19 atoms/$cm^3$. Using phosphorus acid solution at 160° C. produced similar etching rates as with the phosphorus doping polysilicon Examples given above. The conditions and results of these Examples V–XII are shown in TABLE: Phosphoric Acid Etching Rate of Implanted Polysilicon as seen below.

Our experiments have shown that the use of phosphoric acid at elevated temperatures to remove both the silicon nitride and uniformly, heavily doped polysilicon layer with one etching step produces a pitting free monocrystalline silicon surface adjacent to the field silicon oxide regions 20.

TABLE

| Phosphoric Acid Etching Rate of Implanted polysilicon | | | | |
|---|---|---|---|---|
| Example | | thickness (Anstrong) | etching rate (Anstrong/hr) | Process Condition |
| V | before etch | 1925 | | As Imp, 80 KeV, 5E15/cm 3 |
| | after etching | 1311 | | 900 C. Annealing, 30 min |
| | etching loss in 75 min | 614 | 491 | |
| VI | before etch | 1925 | | As Imp, 80 KeV, 5E15/cm 3 |
| | after etching | 280 | | No Annealing |
| | etching loss in 75 min | 1645 | 1316 | |
| VII | before etch | 1925 | | As Imp, 80 KeV, 1E16/cm 3 |
| | after etching | 1098 | | 900 C. Annealing, 30 min |
| | etching loss in 75 min | 827 | 662 | |
| VIII | before etch | 1925 | | As Imp, 80 KeV, 1E16/cm 3 |
| | after etching | 274 | | No Annealing |

TABLE-continued

| Phosphoric Acid Etching Rate of Implanted polysilicon | | | |
|---|---|---|---|
| Example | thickness (Anstrong) | etching rate (Anstrong/hr) | Process Condition |
| | etching loss in 75 min | 1651 | 1321 | |
| IX | before etch | 1925 | | BF2 Imp, 60 KeV, 5E15/cm 3 900 C. Annealing, 30 min |
| | after etching | 1507 | | |
| | etching loss in 75 min | 418 | 334 | |
| X | before etch | 1925 | | BF2 Imp, 60 KeV, 5E15/cm 3 No Annealing |
| | after etching | 733 | | |
| | etching loss in 75 min | 1192 | 954 | |
| XI | before etch | 1925 | | BF2 Imp, 60 KeV, 1E16/cm 3 900 C. Annealing, 30 min |
| | after etching | 1550 | | |
| | etching loss in 75 min | 375 | 300 | |
| XII | before etch | 1925 | | BF2 Imp, 60 KeV, 1E16/cm 3 No Annealing |
| | after etching | 916 | | |
| | etching loss in 75 min | 1009 | 807 | |

While the invention has been particularly shown and described with reference to the preferred embodiments thereof, it will be understood by those skilled in the art that various changes in form and details may be made without departing from the spirit and scope of the invention.

What is claimed is:

1. A method of forming a silicon oxide isolation region on the surface of a silicon wafer comprising:
   forming a thin layer of silicon oxide on said wafer;
   forming a layer of undoped polysilicon on said silicon oxide layer;
   forming a layer of silicon nitride on said polysilicon layer;
   ion implanting an impurity into said layer of undoped polysilicon in a concentration greater than about 5 E 15 atoms/cm$^3$ to form a doped polysilicon layer, and not annealing the doped polysilicon;
   patterning said silicon nitride layer;
   forming said silicon oxide isolation region by thermal oxidation; and
   removing in one continuous etching step, using phosphoric acid (H$_3$PO$_4$) at a temperature of between about 150° and 180° C., said silicon nitride and doped polysilicon layers to complete the formation of said isolation region on the surface of said wafer, wherein the etching rate of said silicon nitride and doped polysilicon are closer because of said not annealing the doped polysilicon.

2. The method of claim 1 in which, during patterning of said silicon nitride layer, a portion of said polysilicon thickness is etched into, leaving a thickness of polysilicon.

3. The method of claim 1 wherein said phosphoric acid is comprised of a solution of water and phosphoric acid.

4. In the manufacture of very large scale integrated circuit device, a method for forming an isolation region on a portion of a planar silicon surface comprising:
   forming an oxidation mask structure on a silicon oxide layer, said structure consisting of a layer of doped polysilicon, said doped polysilicon having been doped by ion implanting into undoped polysilicon with an impurity with a concentration greater than about 5 E 15 atoms/cm$^3$ to form a doped polysilicon layer, and without annealing the doped polysilicon, over said silicon oxide and a layer of silicon nitride over said doped polysilicon layer;
   said mask structure covers the surface regions that are intended to be isolated from other such surface regions;
   forming said isolation region by oxidation of said portion of said planer silicon surface; and
   removing said oxidation mask structure by etching with phosphoric acid (H$_3$PO$_4$) at a temperature of between about 150° and 180° C., that selectively etches silicon nitride and doped polysilicon at substantially the same rate, wherein the etching rate of said silicon nitride and doped polysilicon are closer because of said not annealing the doped polysilicon.

5. The method of claim 4 in which, said doped polysilicon layer is also present on the unmasked portions of said silicon oxide layer, wherein said thickness is less than the doped polysilicon layer which is a part of said oxidation mask structure.

6. The method of claim 5 wherein said thickness of said doped polysilicon layer in said mask structure is between about 1200 to 4000 Angstroms and the thickness of said doped polysilicon layer not part of said mask structure has a thickness of between about 1000 to 3500 Angstroms.

7. The method of claim 6 wherein said phosphoric acid is comprised of a solution of water and phosphoric acid.

8. The method of claim 4 wherein said polysilicon is doped with an phosphorus impurity greater than about 1 E 19 atoms/cm$^3$ which have been ion implanted into undoped polysilicon.

9. The method of claim 4 wherein said polysilicon is doped with an arsenic impurity greater than about 1 E 19 atoms/cm$^3$ which have been ion implanted into undoped 10 polysilicon.

10. The method of claim 4 wherein said polysilicon is doped with an boron impurity greater than about 1 E 19 atoms/cm$^3$ which have been ion implanted into undoped polysilicon.

11. The method of claim 1 wherein said undoped polysilicon is doped with an impurity greater than about 1 E 19 atoms/cm$^3$.

* * * * *

UNITED STATES PATENT AND TRADEMARK OFFICE
CERTIFICATE OF CORRECTION

PATENT NO. : 5,338,750
DATED : August 16, 1994
INVENTOR(S) : Hu Herbert Chao and Hsiao Chin Tuan It is certified that error appears in the above-indentified patent and that said Letters Patent is hereby corrected as shown below:

On the title page, item (73) add:

--Etron Technology, Inc.--
Hsinchu, Taiwan

Signed and Sealed this

Twenty-second Day of April, 1997

Attest:

BRUCE LEHMAN

Attesting Officer

Commissioner of Patents and Trademarks